US010217875B2

(12) United States Patent
Ushinsky et al.

(10) Patent No.: US 10,217,875 B2
(45) Date of Patent: *Feb. 26, 2019

(54) BROADBAND GRAPHENE-BASED OPTICAL LIMITER FOR THE PROTECTION OF BACKSIDE ILLUMINATED CMOS DETECTORS

(71) Applicant: RAYTHEON COMPANY, Waltham, MA (US)

(72) Inventors: Michael Ushinsky, Irvine, CA (US); Mitchell Haeri, Irvine, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/176,519

(22) Filed: Jun. 8, 2016

(65) Prior Publication Data

US 2016/0315205 A1    Oct. 27, 2016

Related U.S. Application Data

(63) Continuation of application No. 14/104,472, filed on Dec. 12, 2013, now Pat. No. 9,397,237.

(51) Int. Cl.
| | | |
|---|---|---|
| *H01L 31/0232* | (2014.01) | |
| *H01L 31/0216* | (2014.01) | |
| *H01L 27/146* | (2006.01) | |
| *G02F 1/35* | (2006.01) | |
| *G02B 5/20* | (2006.01) | |
| *H04N 5/33* | (2006.01) | |
| *H04N 5/374* | (2011.01) | |

(52) U.S. Cl.
CPC ........ *H01L 31/02164* (2013.01); *G02B 5/208* (2013.01); *G02F 1/3523* (2013.01); *H01L 27/1462* (2013.01); *H01L 27/1464* (2013.01); *H01L 27/14623* (2013.01); *H04N 5/33* (2013.01); *H04N 5/374* (2013.01); *G02F 2202/36* (2013.01); *G02F 2203/10* (2013.01); *G02F 2203/52* (2013.01); *H01L 27/14685* (2013.01)

(58) Field of Classification Search
CPC ........ H01L 31/02162; H01L 31/02164; G02B 5/207; G02B 5/208; G02B 5/22
See application file for complete search history.

(56) References Cited

U.S. PATENT DOCUMENTS

| | | | |
|---|---|---|---|
| 4,939,369 A * | 7/1990 | Elabd | G01S 7/486 250/330 |
| 5,153,425 A | 10/1992 | Meinzer et al. | |
| 5,159,199 A * | 10/1992 | LaBaw | G01J 3/02 250/339.02 |

(Continued)

FOREIGN PATENT DOCUMENTS

| | | | | |
|---|---|---|---|---|
| CN | 102102001 B | * | 4/2013 | ............ C09J 163/02 |
| EP | 2541699 A2 | | 1/2013 | |
| KR | 20020030852 A | * | 10/2000 | ................ C09J 4/02 |

*Primary Examiner* — Sue A Purvis
*Assistant Examiner* — Herve-Louis T Assouman
(74) *Attorney, Agent, or Firm* — Lando & Anastasi, LLP

(57) ABSTRACT

An optical device may include a sacrificial limiter filter including at least one layer of graphene disposed on a substrate. The at least one layer of graphene may be configured to absorb and scatter at least a portion of electromagnetic radiation incident on the at least one layer of graphene.

14 Claims, 8 Drawing Sheets

(56) References Cited

U.S. PATENT DOCUMENTS

| | | | |
|---|---|---|---|
| 5,559,336 A * | 9/1996 | Kosai | H01L 27/14627 |
| | | | 250/338.4 |
| 5,808,350 A | 9/1998 | Jack et al. | |
| 5,900,799 A | 5/1999 | Morris | |
| 9,397,237 B2 * | 7/2016 | Ushinsky | H01L 27/1462 |
| 2004/0188617 A1 | 9/2004 | Devitt et al. | |
| 2008/0308407 A1 | 12/2008 | Rostovtsev et al. | |
| 2009/0173883 A1 * | 7/2009 | Kauffman | G01J 3/36 |
| | | | 250/338.4 |
| 2009/0302411 A1 * | 12/2009 | Massetti | B82Y 10/00 |
| | | | 257/447 |
| 2010/0206363 A1 * | 8/2010 | Choi | B82Y 30/00 |
| | | | 136/252 |
| 2011/0012074 A1 * | 1/2011 | Sarkar | B82Y 30/00 |
| | | | 252/586 |
| 2011/0104442 A1 * | 5/2011 | Yoon | B82Y 30/00 |
| | | | 428/152 |
| 2011/0304934 A1 | 12/2011 | Zhao et al. | |
| 2012/0069338 A1 * | 3/2012 | Afzali | G01N 21/553 |
| | | | 356/432 |
| 2012/0175571 A1 | 7/2012 | Sarkar | |
| 2012/0282419 A1 * | 11/2012 | Ahn | B82Y 30/00 |
| | | | 428/34.8 |
| 2013/0027778 A1 * | 1/2013 | Currie | G02B 5/205 |
| | | | 359/580 |
| 2013/0050685 A1 | 2/2013 | Hunt et al. | |
| 2013/0221219 A1 | 8/2013 | Torabi | |
| 2013/0273345 A1 | 10/2013 | Chua et al. | |
| 2013/0293100 A1 * | 11/2013 | Moody | H01J 1/34 |
| | | | 313/542 |

\* cited by examiner

BROADBAND GRAPHENE-BASED OPTICAL LIMITER FOR THE PROTECTION OF BACKSIDE ILLUMINATED CMOS DETECTORS

CROSS-REFERENCE TO RELATED APPLICATIONS

This application is a continuation of and claims priority under 35 U.S.C. § 120 to co-pending U.S. application Ser. No. 14/104,472 titled "BROADBAND GRAPHENE-BASED OPTICAL LIMITER FOR THE PROTECTION OF BACKSIDE ILLUMINATED CMOS DETECTORS" and filed on Dec. 12, 2013, which is herein incorporated by reference in its entirety for all purposes.

BACKGROUND

Recent advances in electro-optics and lasers have facilitated extensive developments in the field of laser hardening components protecting, for example, opto-electronic sensors such as focal plane arrays (FPAs), CCD (charge-coupled device) cameras, imagers, and detectors. Passive filters typically include different thin planar windows that are fabricated from precisely formulated binary and ternary semiconductors. Among these are mercury cadmium telluride (MCT or HgCdTe) and/or gallium indium arsenide (GaInAs) family materials. These types of filters may be suitable for use with infrared sensor devices. These semiconductors transmit mid-infrared signals, having a wavelength often exceeding about 2.5 microns (µm), and block radiation having a wavelength below about 2 microns (µm). The transmission of operational signals through a one millimeter (mm) thick window typically varies from about 40% to about 50%, depending on the crystal/alloy formulation. The absorptive and scattering properties of these filters remain constant over operations with all types of optical signals, including both continuous wave and pulsed signals. The combination of limited optical transmission associated with semiconductor planar windows (less than 50%) with wavefront errors aggravate the detection and reduce the quality of the obtained and processed information. Furthermore, these filters may be relatively expensive due to the sophisticated micro-metallurgical processing and relatively limited yield (about 10-15%).

SUMMARY OF THE INVENTION

Aspects and embodiments of the present invention are directed generally to laser hardening components that may be used for protection of electro-optic sensors and to the fabrication of such laser-hardening components. Some embodiments are directed to a Sacrificial Limiter Filter (an "SLF," also referred to herein as simply a "filter" or a "limiter filter") including one or more coated filtering components. In various embodiments, the SLF may include a Broadband Graphene-Based Optical Limiter (BGBOL). In some embodiments an SLF may be configured and arranged to transmit operational signals to an electro-optic sensor and block unwanted light beams that might otherwise damage the sensor or constitute spurious optical signals which may swamp the signals intended to be detected and analyzed.

In accordance with one or more embodiments, an optical device that is operative in response to electromagnetic radiation in a predefined spectral range and disabled in response to laser radiation exceeding a predefined damage threshold is provided. In at least one embodiment, the optical device comprises a substrate and a sacrificial limiter filter. The sacrificial limiter filter may be configured to be destroyed by the laser radiation exceeding the predefined damage threshold. In one or more embodiments, the sacrificial limiter filter may include at least one layer of graphene disposed on the substrate. The at least one layer of graphene may be configured to absorb and scatter at least a portion of electromagnetic radiation incident on the at least one layer of graphene.

In accordance with some embodiments, the optical device is a focal plane array (FPA) or a charge coupled device (CCD) camera. In certain embodiments, the optical device is a backside-illuminated FPA or CCD camera.

In accordance with some embodiments the at least one layer of graphene further comprises at least one polymer having the graphene contained therein. The at least one polymer may include an epoxy oligomer, wherein the epoxy oligomer is at least one of an optical adhesive and an optical photoresist. In at least one embodiment, the at least one layer of graphene further comprises at least one allotrope of carbon. In certain embodiments, the concentration of graphene in the at least one polymer is in a range of about 0.2% to about 3% by weight.

In accordance with some embodiments, the optical transmission of the at least one layer of graphene is at least 70% in the predefined spectral range.

In accordance with some embodiments, the at least one layer of graphene is a first layer of graphene and the sacrificial limiter filter may further comprise a second layer of graphene. According to certain embodiments, a layer of dielectric material may be sandwiched between the first and second layers of graphene.

In accordance with some embodiments, the substrate is a silicon substrate integrated into the optical device. In other embodiments, the optical device may further comprise an aperture, and the substrate may be a glass substrate positioned proximate the aperture.

In accordance another aspect of the present disclosure, a method of fabricating a sacrificial limiter filter for an optical device is provided. The method may comprise depositing at least one layer of graphene onto a surface of a silicon substrate of the optical device. In one or more embodiments, the optical device is a backside-illuminated focal plane array or a backside-illuminated charge coupled device camera.

In accordance with some embodiments, depositing the at least one layer of graphene comprises growing the at least one layer of graphene onto the surface of the silicon substrate.

In accordance with some embodiments, the silicon substrate is a first substrate and depositing the at least one layer of graphene comprises transferring the at least one layer of graphene from a second substrate to the first substrate.

In accordance with some embodiments, depositing the at least one layer of graphene further comprises depositing at least one polymer. According to certain aspects, the at least one polymer may have the graphene contained therein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
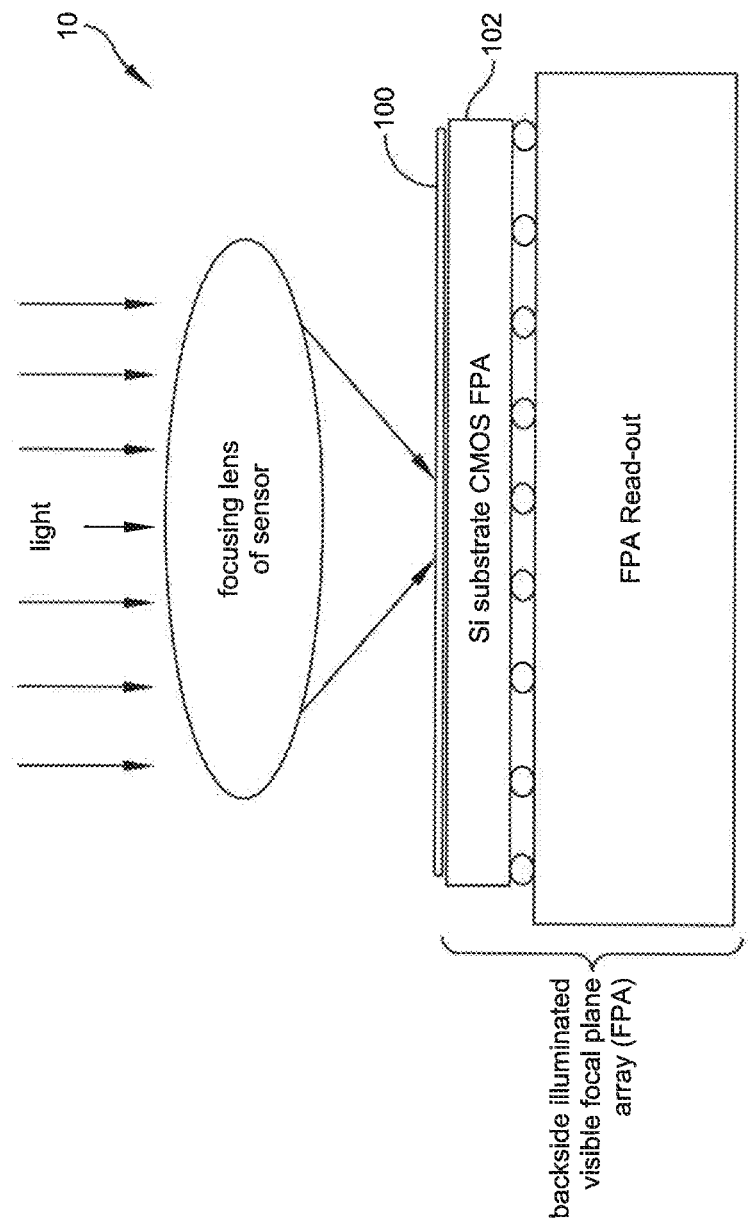
FIG. 1 is an example of a Broadband Graphene-Based Optical Limiter (BGBOL) including a frontal arrangement of a single, dual- or multi-layer of graphene deposited onto a substrate of an optical device.

Opto-electronic sensors, CCD cameras, imagers, detectors, and other photosensitive devices may desirably be provided with a mechanism to facilitate protection against unwanted laser radiation, which might otherwise damage or impair the functionality of such devices. Some forms of protection mechanisms may include, for example, filters that may be placed in the path of optical radiation into apertures of such devices. The filters may provide protection by admitting certain wavelengths of light while blocking others, and/or by admitting optical radiation below a certain intensity while blocking higher intensity optical radiation.

In addition to semiconductor planar windows, optical limiting may also be achieved by using composite windows that incorporate, for example, fine carbon black suspensions, carbon allotropes such as fullerenes (e.g., C60 and others), and one or more different carbon nanotube (CNT) products. For example, in U.S. Publication No. 2011/0304934 (hereinafter US '934), C60-based solutions provide adequate limiting at 532 nm, but suffer from a low laser damage threshold and do not meet the performance requirements for broadband limiting. Carbon black fine particulate suspensions do satisfy performance requirements for broadband limiting, but their response is not adequate for short (picosecond type) pulses. U.S. Publication No. 2012/0175571 (hereinafter US '571) describes a film of a hyperbranched polymer having short multiwall carbon nanotube (sMWNT) fillers. This film is sandwiched between two glass substrates to form the window. The technical solution shown in US '571 assumes certain optimum concentrations of CNT fillers that do not exceed 3% by weight. The technical solution disclosed in U.S. 2011/0012074 (hereinafter US '074) shows that CNT-based polymers can also include one or more multi-photon chemical absorbers (MPA) or reverse saturable absorbers RSA) chromophores. The CNT-based optical limiters may include C60 fullerenes, providing a combined limiting mechanism associated with nonlinear optical absorption and scattering modes. These modes may induce localized heat flux affecting not only the light transmission, but causing the material degradation of the polymer composite matrix around the CNT or C60 clusters. The filters may be configured to be destroyed by laser radiation exceeding a predefined damage threshold. Therefore, these limiters are essentially sacrificial.

A single laser damage spot in these filtering devices may vary from 10 to 30 microns in diameter. The sacrificial filters that are configured with a standard 25.4×50.8 mm (microscope slide) glass substrate may be able to withstand nearly 100 localized damages, while blocking just 1-2% of the protected area. Beyond this, the limiter has to be replaced. In addition, when these devices are embedded into an optical polymer matrix, the CNT/C60 limiters exhibit optical transmission exceeding 50%, and often approaching 70%. Commercial fabrication of the advanced carbon allotropes combined with the relatively simple fabrication of polymer composite films makes these limiters inexpensive and suitable for periodic replacement. For example, a typical 6.25× 6.25 mm silicon chip having 100 laser damage craters, each with a 10-micron diameter, may only comprise 0.02% of the total area. In the case of a BGBOL that is directly deposited onto the silicon substrate of an optical device, the losses of important information on the partly destroyed area may be insignificant. In the case of BGBOL designs associated with graphene or graphene-polymer coatings deposited onto a glass substrate, the adverse effects of laser damage and signal losses may be even smaller, since the filter may be equipped with a holder that allows for translational or rotational motion of the filter.

Aspects and embodiments of the present invention are directed generally to laser hardening components, such as SLFs, which may be used for protection of electro-optic sensors and to the fabrication of such laser hardening components. Embodiments of the laser hardening components may include a neutral density passive or actively tuned electro-optical filter. Embodiments of the laser hardening components may comprise an SLF. Embodiments of the SLF's disclosed herein may facilitate blocking unwanted light that would otherwise constitute spurious optical signals and/or swamp the signals to be detected and analyzed by an electro-optic sensor used in, for example, ground vehicles, airplanes, or satellites.

Among these filters are limiters that include one or more allotropes of carbon, such as fullerenes, CNTs, and graphenes, including partly oxidized graphenes. Although the introduction of a filtering/limiting component into an optical path may result in changes to the optical and thermal performance, certain advantages of a graphene film may be related to its thinness (less than one nm), unique optical transmission, saturated nonlinear absorption, and superior thermal and electrical conductivity. As discussed further below, in the case of a polymer-graphene layer with a small concentration of graphene and in instances where the polymer exhibits low light absorption and scattering, the formed layer may also minimize distortions and optical losses. In contrast to bulk semiconductor or glass substrate filters having nonlinear particulate absorbers (including black graphite particulates, CNT, and fullerene fillers), the operational signals taken through the planar network of carbon atoms in graphene may be processed with minimum losses of important information, while also limiting unwanted laser radiation that can form hardening defects.

In some embodiments, an SLF may include a substrate made of a material such as glass or a polymer which may be transparent to a wavelength of light of interest. One or more nano-coatings may be present on the substrate. The nano-coatings may be selectively tuned to certain operational and blocking bands, so they can transmit, for example, infrared operational signal(s) and block unwanted light. In some embodiments, one or more nano-coatings or the SLF as a whole may be sacrificial, in that they may be damaged or destroyed during use. In one or more embodiments, the nano-coating is made of graphene.

The use of graphene allows for designing improved broadband optical limiters. For example, the graphene-based filter may be capable of protecting detectors and sensors from pulsed laser damage. In addition to providing superior limiting performance, graphene may be placed directly on the detector substrate to enhance the optical limiting effect.

By way of introduction, some embodiments are directed to a BGBOL, which is an exemplary SLF that may include one or more graphene coated filtering components. In some embodiments, a BGBOL may include a broadband graphene-composite film that forms an optical limiter. In one or more embodiments, this limiter may be integrated with a silicon-based CMOS (Complementary Metal Oxide Semiconductor) FPA or CCD camera. The BGBOL may be configured to transmit different operational signals (such as infrared) to an electro-optic sensor and may also block unwanted light beams that might otherwise damage the sensor or constitute spurious optical signals that swamp the signals intended to be detected and analyzed. Embodiments of a BGBOL in accordance with the present disclosure may facilitate blocking unwanted light in different types of commercial CCD focal planes. These large area focal planes may provide high resolution (up to 8 megapixels or higher) arrays. Some embodiments of a BGBOL in accordance with the present disclosure may comprise a silicon-based CMOS FPA having one or more layers of graphene deposited onto the substrate of a commercial FPA, or may include a thin substrate comprising a polymer-graphene protecting layer. In accordance with one or more embodiments, a BGBOL may include a frontal arrangement of one or more layers of graphene that are deposited onto a silicon substrate of a commercial BSI CCD camera or sensor/detector. This configuration may provide efficient laser hardening and sensor protection by the graphene film. In particular, this configuration may minimize deviation in performance of a high quantum efficiency (QE) BSI sensor/detector.

Referring to FIG. 1, there is illustrated an example of a BGBOL 10 having a frontal arrangement of a graphene-based limiter 100. The graphene-based limiter 100 may be formed from a polymer-graphene layer, or from one or more layers of graphene. As illustrated in FIG. 1, the graphene-based limiter 100 may be deposited or grown onto a silicon (Si) substrate of an optical device, such as an FPA 102. For example, this film 100 may be integrated with a silicon-based CMOS (complementary metal-oxide-semiconductor) FPA and further incorporated into an object-detection sensor. In alternative embodiments, the graphene-based limiter 100 may be deposited onto or attached to a silicon substrate of a commercial backside illuminated CCD.

Some embodiments of a BGBOL in accordance with the present disclosure may comprise a silicon-based CMOS FPA having a single layer, multi-layer, or dual-layer of graphene deposited onto the silicon substrate of the FPA. Returning to FIG. 1, a BGBOL 10 in accordance with embodiments of the present invention may include a film comprising one or more layers of two-dimensional graphene. The filmed coating may be fabricated from a CVD grown graphene and transferred to the frontal surface of the silicon sensor/detector or deposited on that surface in the form of a polymer/graphene composite.

The deposition processes for the graphene nano-coating may include any physical vapor deposition processes such as used in semiconductor device fabrication, for example, evaporative deposition or electron beam physical vapor deposition. In various instances, the optical transmission of the graphene film may depend on thickness in an essentially non-linear manner, depending on numerous factors associated with the physical properties of the graphene and the film thickness.

According to certain aspects, the BGBOL may incorporate a graphene film that is grown onto a silicon substrate, such as a silicon wafer, using chemical vapor deposition (CVD) methods, which may function as a semiconductor substrate for a commercial BSI CCD. This configuration may minimize interfacial defects, and allow for proper insulation of thermal fluxes induced in the graphene coating due to plasmon resonance and may further facilitate quick transitional heat transfer. These grown films may form multi-domain contiguous planar deposits. Once created, CVD grown graphene may be transferred and attached to different substrates. In alternative embodiments, the graphene flakes may be impregnated (mixed) into a suitable polymer matrix, so the formed composite layer may be deposited onto the frontal surface of a silicon sensor/detector or onto a glass substrate that may be further inserted in front of a detector. Suitable substrates used for the CVD growth of graphene include, but are not limited to, copper and nickel. For example, the CVD processes for the graphene layers may facilitate large area single or dual layer graphene growth on copper or nickel foil substrates. The films grown on these substrates may then be transferred onto silicon or Si/SiO2 target wafers, or in some instances, transferred directly onto the silicon substrates of the BSI sensors/detectors. Thus, the frontal surface of a silicon chip in a CCD camera, imager, detector, or any other photosensitive devices may become the target substrate for the transferable graphene film.

One or more other commercially available and inexpensive options may also be associated with the CVD grown graphene. For example, the CVD grown graphene may be a transparent electro-conductive layer structurally integrated with a silicon semiconductor and/or dielectric glass chip. In this arrangement, the silicon surface of the sensor/detector may have an oxidized layer of SiO2, with a thickness ranging from 0.1-1 microns. In certain instances, the number of stacked atomic layers may have to be verified for the commercial graphene film products, and the parameters and characteristics of the graphene stack may have to be established experimentally. In one or more instances, the optical absorption of white light by a single layer of graphene may be about 2.3%, and therefore a resulting stack capable of transmitting 75-80% of operational signal may require about 8-11 graphene layers. In this case, the properties of the layers of graphene differ dramatically from those exemplified by thick layers of graphene (i.e., 100 or more layers).

A silicon chip of a sensor/detector may be formed from a pre-coated graphene wafer, such as those available under the trade name CVDGraphene™ (available from Graphene Laboratories, Inc., Calverton, N.Y.). This processing technique may eliminate the need to transfer graphene film, as described further below. In other embodiments, the SGL may incorporate graphene using a configuration where a graphene film is adhesively attached onto a substrate.

The graphene used in one or more embodiments may include clustered powder flakes of partly oxidized graphene and different suspensions of oxidized graphene in water or organic solvents. For example, conductive graphene dispersion solutions and graphene nanopowder kits, such as those sold by the Graphene Supermarket (Calverton, N.Y.) are commercially available. These products may be available in different concentrations, so in certain instances the graphene limiting layer may comprise a polymer matrix that includes nano-fillers of graphene. As discussed further below, the graphene/polymer matrix may be formed using different technological methods, including optical path micro-integration and micro-lithography.

In some embodiments, the one or more layers of graphene may be impregnated into a polymer. In some embodiments, a polymer-graphene protecting layer may be lithographically coated onto an inexpensive thin glass substrate that may further be inserted into an optical path of a sensor. For example, the glass substrate may be positioned proximate an aperture of an optical device. In other embodiments, the composite graphene/polymer layer may be further deposited onto a silicon substrate surface of a BSI optic device. Microlithography techniques may be used for depositing the composite graphene/polymer layer. The polymer matrix may be fabricated from one or more suitable polymers, for example, acetate or epoxy oligomers. Among the suitable commercial products are different epoxy photo resists and optical epoxy adhesives. For example, the polymer matrix may include acetate or dendrite epoxy oligomers. Dendrite epoxy oligomers form dendrite type submicron cells of nearly uniform micro-dimensions, allowing the carbon fillers to be distributed uniformly within the cell-based coating film.

According to certain aspects, the polymer used in a graphene/polymer configuration may be an epoxy oligomer having a high refractivity. For example, the epoxy oligomer may have a refractive index that is similar to inorganic glass. In certain examples, the epoxy oligomer may have a refractive index from about 1.45 to about 1.65. Further, the epoxy oligomer may also have low light absorption.

Among commercially available epoxies, two classes of materials may be used. The first class is associated with optical epoxy adhesives used in the telecommunication industry, such as EPOTEK 353 ND and 327 (available from Epoxy Technology Inc., Billerica, Mass.). These epoxy materials may be capable of forming a curable polymer matrix with the graphene and may exhibit low absorption. The second class is associated with different epoxy photo resist compounds, i.e., those used in microlithography processes, such as SU-8 (different grades) and others, depending on the specific application. Graphene may be pre-mixed with one or more of these epoxies to produce a 0.2%-3% (by weight) composition. The formed composite may be ultrasonically excited for about 2-3 minutes and then out-gassed. The mixture may subsequently be deposited onto a thin glass substrate or may be deposited directly onto a silicon wafer substrate of a CCD camera that has been decontaminated prior to the deposition. The thickness of the deposition may be from about 50 microns to about 120 microns, depending on different formats and architectures of CCDs, and may also depend on particular performance requirements and applications. According to some embodiments, the graphene/polymer film may be, for example, from about 30 microns to about 100 microns in thickness.

According to various aspects, the polymer may be a gelatin material. For example, the gelatin material may be a gelatin photoresist material. In some embodiments, the gelatin may be an alcohol-based material. The gelatin may be any material that is suitable for performing one or more functions of an SLF as disclosed herein.

The electro-optical, thermal, and geometrical characteristics of the resulting layer may be established by conducting preliminary experiments. For example, in some embodiments, a 50-150 micron thick layer of SU-8 photoresist mixed with graphene flakes at a 0.2%-2% mass concentration may be suitable for laser protection of unwanted radiation in a one-micron wavelength band. According to some embodiments, the graphene/polymer film may transmit infrared operational signals having wavelengths of, for example, between about two and about eight microns at between about a 60% and about an 85% level and block unwanted light beams, for example, light having a wavelength in the one micron band, with an attenuation of about 99% or greater. For example, according to some embodiments, the graphene/polymer film may be capable of transmitting 75-85% of the infrared operational signal(s) and block (with an attenuation of about 99% or greater) unwanted light beams.

The concentration of constituent fillers and properties of the polymer matrix carrier may be selected to employ saturable absorption and scattering mechanisms when unwanted radiation hits the filter film. The blocking/limiting response in the graphene/polymer film may be ultrafast. For example, the optical scattering and absorption mechanisms of the graphene included in the graphene/polymer film may occur on femtosecond timescales, rendering the time response of a filter including a graphene/polymer film as disclosed herein ultrafast.

According to certain aspects, the graphene coating may be combined with a polymer film containing carbon nano-tubes (CNT), and/or fullerenes, for example, "buckyballs" which in some embodiments may each include 60, 70, 74, 80 or other numbers of carbon atoms. For example, according to some embodiments, the BGBOL may incorporate graphene by using a graphene/polymer composition such that the BGBOL includes a polymer matrix that is filled or infused with one or more carbon allotropes, including carbon nano-tubes, fullerenes, and/or graphene. Design of the BGBOL may further include optimizing the concentration and deposition of the formulated nano-composite material to facilitate a desired resolution of patterning, for example, by using microlithography and cure processes. An evaluation of conditions resulting in ultrafast saturation of the polymer matrix may be performed to further refine the design of a limiter having one or more carbon allotropes.

The BGBOL may further include optimization of one or more additional fillers at different concentration levels, depending on the suitable deposition technique for the formulated composite material. For example, the BGBOL may be configured to facilitate a desired pattern resolution using microlithography techniques. In certain instances, an evaluation may be performed to determine the conditions for ultrafast light saturation in the composite comprising one or more allotropes of carbon and to further refine one or more device designs.

CNT products, including single wall and multi-wall nano-fillers may exhibit dynamic and electro-phoretic scattering that is characterized by the polydispersity of CNT aggregates and nano-dispersity of individual CNTs. The dimensional and mass parameters of a particular CNT filler constituent may affect the polydispersity and nano-dispersity and in turn, the nonlinear saturation scattering. In some embodiments of a graphene/polymer coating that reacts to light in the one micron band, the size of CNT fillers may be characterized by a near Gaussian distribution centered at about one micron with a weight concentration in the graphene/polymer film of between 0.5% and about 2.5%. For different polymers in the graphene/polymer film, the mass parameters of the carbon allotropes may be modified to achieve a coating reactive to a desired frequency of optical radiation. For multi-walled nanotubes having different numbers of walls, the dimensional and mass parameters of nano-scattering tubes may be different for the same polymer matrix to achieve a desired degree of reaction to a desired frequency of optical radiation.

Unwanted laser radiation may also trigger the nonlinear absorption/scattering mechanism present in the graphene layer which may block the unwanted light. The concentration of constituent fillers and properties of the additional polymer matrix carrier in the graphene/polymer coating may be selected to exhibit non-linear saturable optical absorption and scattering mechanisms when unwanted optical radiation encounters the filter. The nonlinear optical properties of the carbon allotropes, including fullerenes, CNT, and graphene, may differ in their micro-mechanisms. For example, the CNT fillers may exhibit nonlinear scattering, while the fullerene clusters may exhibit excited state absorption nonlinearity. The graphene constituent may exhibit both nonlinear scattering and two-photon-absorption mechanisms. The graphene material, including sheet films and graphene oxides, may also exhibit different types of nonlinearity.

A fullerene filled polymer may form a conjugated polymer-fullerene heterojunction network that may be sufficient for photo-electron transfer between the donor-polymer and the acceptor-fullerene. The photo-excited species are dissociated at the polymer-fullerene film composite at relatively small concentrations. These concentrations may vary for different fullerene allotropes (allotropes having different numbers of carbon atoms) and for different polymer matrixes. For example, a concentration of C60 fullerene impregnated into epoxy oligomers may be greater than about 0% and less than about 2.5% by mass to provide satisfactory optical response. According to some aspects, graphene may be incorporated as a filler material into the polymer. In the case of graphene absorbers, the desired concentration may vary depending of the texture, for example, the size distribution of the flakes, the number of actual layers, and the degree of folding of the graphenes. In some embodiments including one or more fillers, for example, graphene and fullerene, satisfactory results may be obtained with a total carbon allotrope concentration of above about 0% and below about 2.5% by mass. The planar dimensional parameters of graphene flakes may be established to exhibit a desired Van Hove peak in absorption. For example, for absorption of optical radiation in the one micron band, graphene flakes having a characteristic dimension, for example, a diameter of between about 1.5 microns and about three microns may provide a desired level of performance.

The concentration of constituent fillers and properties of the polymer matrix carrier in the graphene/polymer film may be selected to exhibit non-linear saturable optical absorption and scattering mechanisms when unwanted optical radiation hits the filter. For example, the BGBOL may further include optimization of one or more additional fillers at different concentration levels, depending on the suitable deposition technique for the formulated composite material. In certain instances, an evaluation may be performed to determine the conditions for ultrafast light saturation in the composite comprising one or more allotropes of carbon and to further refine one or more device designs. As previously mentioned, the nonlinear optical properties of the carbon allotropes, including fullerenes, CNT, and graphene, may differ by their micro-mechanisms. For example, the CNT fillers may exhibit nonlinear scattering, while the fullerene clusters exhibit excited state absorption nonlinearity. The graphene constituent may exhibit both nonlinear scattering and two-photon-absorption mechanisms or primarily two-photon-absorption mechanisms. The concentration of constituent fillers and properties of the polymer matrix carrier may be selected to employ saturable absorption and scattering mechanisms when the unwanted radiation hits the graphene and the complimentary polymer coating. The graphene allotropes, including multiple sheet flake films which may include graphene oxides, may also exhibit different types of nonlinearity that affect limiting at short pulses. The fullerenes, CNT, and graphene nano-fillers may each exhibit similar optical transmissions of between about 70% and about 80% for operational signals having wavelengths of, for example, between about two and about eight microns.

Various embodiments of a graphene/polymer film may be characterized by different ratios of nano-fillers. A desired concentration of the nano-fillers may be selected to provide a desired level of saturable absorption and optical scattering. In some embodiments, the sum of all the carbon allotropes in the graphene/polymer film does not exceed about 2.5% by weight of the graphene/polymer film. In particular embodiments, depending on the response criteria, the ratio of fullerenes, for example, C60 fullerenes, CNT, and graphene constituents can vary as (0.2-0.5):(1-1.4):(0.1-0.5) by weight. When selecting the concentration, the coating responses may be selectively tuned for certain bands to induce high intensity plasmon generation at one or more desired frequencies of incident radiation.

An exemplary SLF may include a graphene/polymer matrix material that constitutes about 2% graphene and has a thickness of about 50 microns. The SLF may be capable of blocking light from a 1065 nm laser and possess a transmittance of 70% or higher. The SLF may be capable of withstanding 70-100, or more, repeated impacts from the laser.

According to some aspects, the BGBOL may include a second coating comprising a polymer film embedded with one or more types of non-linear saturable carbon allotropes, such as CNTs and fullerenes. The second coating may be formed over a first layer/nano-coating of graphene. In some embodiments, the second coating may be thicker than the first layer of graphene film. The second coating may be a nano-coating that may also transmit operational signal(s), for example, infrared operational signals, and block unwanted light beams, for example, light beams having undesired frequencies and/or intensities. The second nano-coating and/or the first nano-coating may be formed of materials and with dimensions to preferentially block light radiation in the one micron band, for example, light having a wavelength of about 1064 nm and/or about 1030 nm and/or laser frequencies consistent with the output of lasers which may be used in military defense applications, for example, a yttrium aluminum garnet (YAG)-based laser. The concentration of constituent fillers and properties of a polymer matrix carrier in the second nano-coating may be selected to employ saturable absorption and scattering mechanisms to block unwanted radiation which hits the coating. The time response to an applied optical signal in embodiments of the polymer/carbon allotrope coating may be ultrafast because the scattering and absorption mechanisms in nano-clustered carbon allotropes may occur on a femtosecond time scale.

In some embodiments, design of a BGBOL may include the selection of one or more graphene protective coating materials and thicknesses, so that operational light beams may transmit operational light without spectral reshaping or with a well predicted correction of transmission and reflected spectra. In certain instances, the transmission may exceed 70%. In some instances, the transmission may exceed 80%. In still other instances, the transmission may exceed 85%. For example, a CNT/C60 based composition may result in 70% transmission. The transmission may be dependent on the concentration or density of the graphene in the coating material, with higher concentrations or densities yielding a reduced transmission. The special properties of a two dimensional carbon atom network, such as the ability to form ballistic-type conductors that interface with the silicon semiconductor, may also contribute to optical transmission in different bands. Among these special properties is the ability to generate the relatively broadband surface plasmons and to provide conditions for ballistic resonant conductivity/resistivity. In particular, signal light transmission and heat generation differ dramatically in resonant and resonant-free bands. The limiting response may be targeted to be adequate for specific formats and architectures of CCDs and to provide suitable localizations of laser damages (with smaller diameters of the resulting laser damage crater being more desirable), so the limiter can still be used after experiencing multiple shots from an incoming laser.

Limiting filters that include one or more allotropes of carbon may experience hardening effects that differ depending on whether the detectors have front or backside illumination arrangements. In the case of backside illuminated (BSI) sensors/detectors, the metal circuitry and dielectric layers reside below the sensor arrays, providing the most direct path for light to travel into the pixels. The backside illumination may be characterized by higher quantum efficiency, a larger and optimized fill factor, minimum color deviation, and may be used primarily for low-light sensitivity applications. In front side illuminated (FSI) sensors/detectors, light travels to the photo-sensitive area through the front side of the pixel, and therefore first passes through the transistors, dielectric layers, and the metal circuitry, which may block or deflect the light into neighboring pixels. Thus, the FSI architecture reduces the fill factor and quantum efficiency and may lead to cross-talk between neighboring pixels. The difference in stack architecture and operational principles may also affect the different resistances of the limiters used to protect FSI and BSI systems from laser damage from unwanted laser beams. In the case of a BSI having pixels and circuitry located behind a 100 to 200 micron thick silicon wafer, the laser damage hardening mechanism involves both surface plasmon generation at the interface of silicon and graphene, and damage to the silicon substrate itself.

In some embodiments, essentially different light blocking mechanisms in the graphene nano-coating and in a polymer/carbon allotrope nano-coating can effectively limit and block different laser threats to an optical sensor. Efficient light absorption, scattering, and phase conversion mechanisms may form highly localized heat fluxes that may thermally damage the nano-coatings and/or the substrate(s) of embodiments of the filter. Some embodiments of the filter may employ inexpensive substrate and coating materials. It may thus be economically feasible for embodiments of the filter to be sacrificial and to be replaced after a desired number of uses. An inexpensive SLF in accordance with embodiments of the present invention may be used several times until the reduced amount of information associated with partly damaged pixels will affect the image taking and analysis processes.

Embodiments of the filter may be sacrificial due to the localized thermal damage of coated film exposed to unwanted optical radiation. However, embodiments of the filter may be used several times until the reduced amount of information transmitted through the filter to, for example, a CCD camera or other sensor may affect the image taking process. In some embodiments a filter as disclosed herein may be exposed to unwanted radiation and sustain irreversible damage up to 100 times or more and still be capable of transmitting up to about 96% of the information which could be transmitted through a new, undamaged filter. This feature may make an SLF as disclosed herein especially desirable for battlefield uses where an optical sensor may be exposed to multiple hits of unwanted radiation before having an opportunity to be serviced.

When an unwanted light beam hits the filter and/or external electric current applied, an induced electromagnetic field may generate surface plasmon resonance in the graphene nano-coating. The resonating electric currents and ballistic conductivity mechanisms in the graphene nano-coating may cause an increase in the temperature of the nano-coating. The increased temperature may quickly approach the melting temperature of one or more materials that form the graphene nano-coating. In some embodiments, an unwanted light beam with a power level consistent with certain laser systems utilized in the field of defense, for example, between about 0.1 W and about 10 W may be sufficiently powerful to induce plasmon resonance and melt the nano-coating. Even low to moderate power laser beams, for example beams having a power of about 1 W, can cause plasmon resonance at certain frequencies which may become sufficient for the melting and phase transition of the graphene nano-coating.

A phase transition in the graphene nano-coating due to its melting and accompanying re-crystallization may lead to an increase in the light absorption coefficient (the imaginary part of a refractive index) of the filter by 2-3 orders of magnitude depending on the wavelength of the light and the materials of the SLF. This phase transition effect may dramatically block unwanted light.

The graphene film interface may possess ballistic thermal and electric transport properties, and may be capable of generating surface plasmons at this interface that further protect from any unwanted laser radiation. The plasmons may induce strong confinement and enhancement of electric fields in the vicinity of the graphene nano-conductor. This enhancement may also stimulate the Raman spectral response, plasmon induced fluorescence, and surface plasmon enhanced absorption and scattering. These energy dissipative mechanisms may play a unique role in the laser hardening and optical limiting processes, including those associated with BSI type sensors/detectors. The plasmon resonance from unwanted laser radiation in certain anticipated bands may be reflected in the BSI protection architecture. In particular, the specific graphene film interface with the silicon wafer may be tuned to maximize energy enhancement and dissipation. According to certain aspects, the tuning may be achieved by forming at least two sequentially attached films that may be separated by a dielectric nano-layer of oxide (such as SiO2). The graphene layers that are separated by the nano-spacers may be capable of forming a dipole conductive structure. These and other optimization methods of the basic design may lead to the generation of oscillating plasmon dipoles, which may in turn affect the hardening of the BGBOLs.

Embodiments of an SLF as disclosed herein may also include a stacked coating comprising alternating layers of low and high refraction dielectric film materials. This type of construction may provide for better imaging when used with certain types of image sensors. The stacked coating may spectrally modify an operational signal facilitating compatibility with certain commercially available sensors. In various embodiments, these dielectric coatings may be deposited along with the graphene film. The dielectric coatings may be selected to minimize thermal mismatch between other materials in the SLF, for example, oxide coating materials or substrates and eutectic alloys. Various electro-optical sensors and CCD cameras may be designed for certain commercial bands of light. An operational signal reflected from, for example, ground objects, tactical sources, and/or landscape, may desirably be pre-processed, for example to provide gain flattening, spectral shaping, or some other functions with, for example, an alternating stack of dielectrics. Embodiments of an SLF may be a suitable component for this pre-processing of operational signal combined with laser hardening/protection in different bands.

Figure 2:
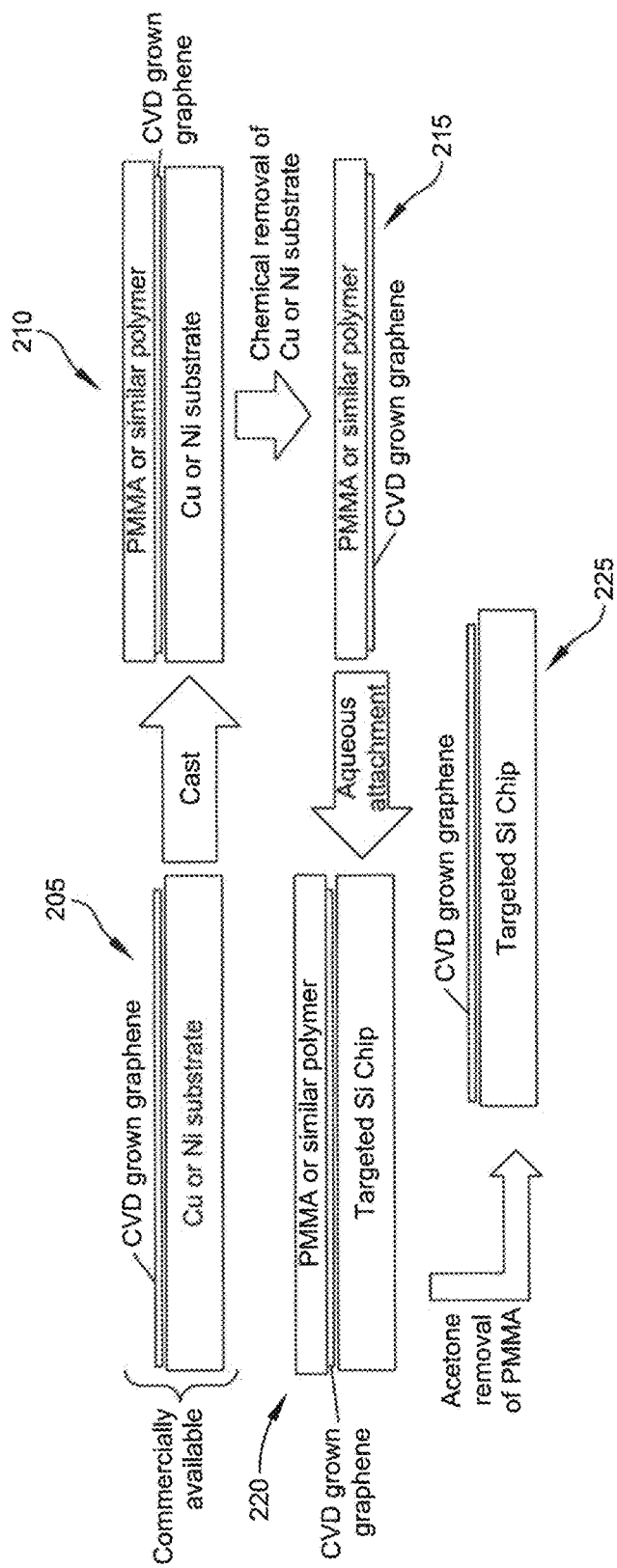
FIG. 2 illustrates an example of a process for transferring CVD grown graphene from a copper or a nickel substrate onto a separate substrate, such as a silicon substrate for an optical device.

One example of a graphene transfer process to a silicon chip is schematically illustrated in FIG. 2. The transfer process may start with step 205 by growing or obtaining a CVD-processed graphene film, for example, by obtaining a substrate that has been pre-coated with one or more layers of graphene. This may be followed by step 210 which includes drop casting a sacrificial (e.g., PMMA) polymer film. In step 215, chemical "removal" of metal foil using acid or other suitable etching solvent may be performed. Step 220 may include aqueous attachment of the polymer (PMMA) casted graphene to the targeted silicon chip. Final removal of the sacrificial polymer layer (PMMA) by a solvent, such as acetone, may be done in step 225. The transfer of graphene described by the above four-step process is only one example, and other equally efficient or convenient transfer processes may alternatively be used. Suitable graphene transferring kits are also available commercially, including one or more products sold by CheapTubes.com (Brattleboro, Vt.) and Graphene Laboratories, Inc. (Calverton, N.Y.).

Embodiments of the transfer process may provide strong structural integrity of the graphene film to the top surface of a silicon chip. Assuming that the lattice parameter of a single layer of graphene is about 1.4 Angstroms, and the distance between two stacked layers of graphene is about 3.4 Angstroms, the total thickness of the transferred film may vary from about 5.2 Angstroms to about 15 Angstroms. With these thin dimensions, the operational signals taken through the resulting planar network of carbon atoms in multilayer graphene may be processed with minimum losses of information, while also limiting the passage of unwanted laser radiation that can form hardening defects.

According to certain aspects, the SLF may be fabricated using microlithography techniques. In some embodiments, a polymer-graphene protecting layer may be lithographically coated onto an inexpensive thin glass substrate that may further be inserted into an optical path of a sensor. For example, a glass substrate may first be cleaned and then deposited with one or more layers of graphene/polymer photoresist material. Suitable techniques for depositing the graphene/polymer material may include spin-coating the material onto the substrate. The resulting substrate and material may then be exposed to UV, UV/Thermal, or RT energy to cure the material. An optional pre-bake/chill and/or post-bake/chill may also be performed.

According to another aspect, the SLF may be fabricated using a wet chemistry process. For example, a glass substrate may first be cleaned and then deposited with a layer of graphene/polymer material. The substrate and material may then be thermally cured at a predetermined temperature for a predetermined amount of time. For example, the cure may be performed at 125° C. for about 1 hour.

In some embodiments, the graphene or graphene/polymer coating may include a micro- and/or macro-patterning so that the plasmon resonance magnitudes can be increased as compared to a non-patterned nano-coating. Patterning may also be performed on CNT or fullerenes that are incorporated into the SLF and may be used for tuning of resonance responses to certain bands of wavelengths. In some embodiments, the graphene film may include periodically patterned walls. The patterning of the graphene nano-coating may fine tune the graphene nano-coating to exhibit surface plasmon resonance when exposed to desired frequencies of optical radiation. The induced plasmon resonance may in turn trigger resonating electric currents and ballistic conductivity mechanisms that may result in a temperature elevation in the graphene coating. For example, patterning of the graphene nano-coating, for example, with a dual periodic patterning may enhance the plasmon resonance and heat generation upon application of optical radiation. The engineered patterning may facilitate operation protection for low to moderate power beams of unwanted radiation. The patterning may be formed by lithographic techniques and/or chemical etching and/or other methods. The patterns may include dual-periodic systems of rounded or linear segments. The patterns may be open and may be symmetrical.

EXAMPLES

The function and advantages of various embodiments will be more fully understood from the following non-limiting examples. These examples are intended to be illustrative in nature and are not to be considered as limiting the scope of the embodiments discussed herein.

Example 1—Damage Induced without Use of an SLF

Figure 3:
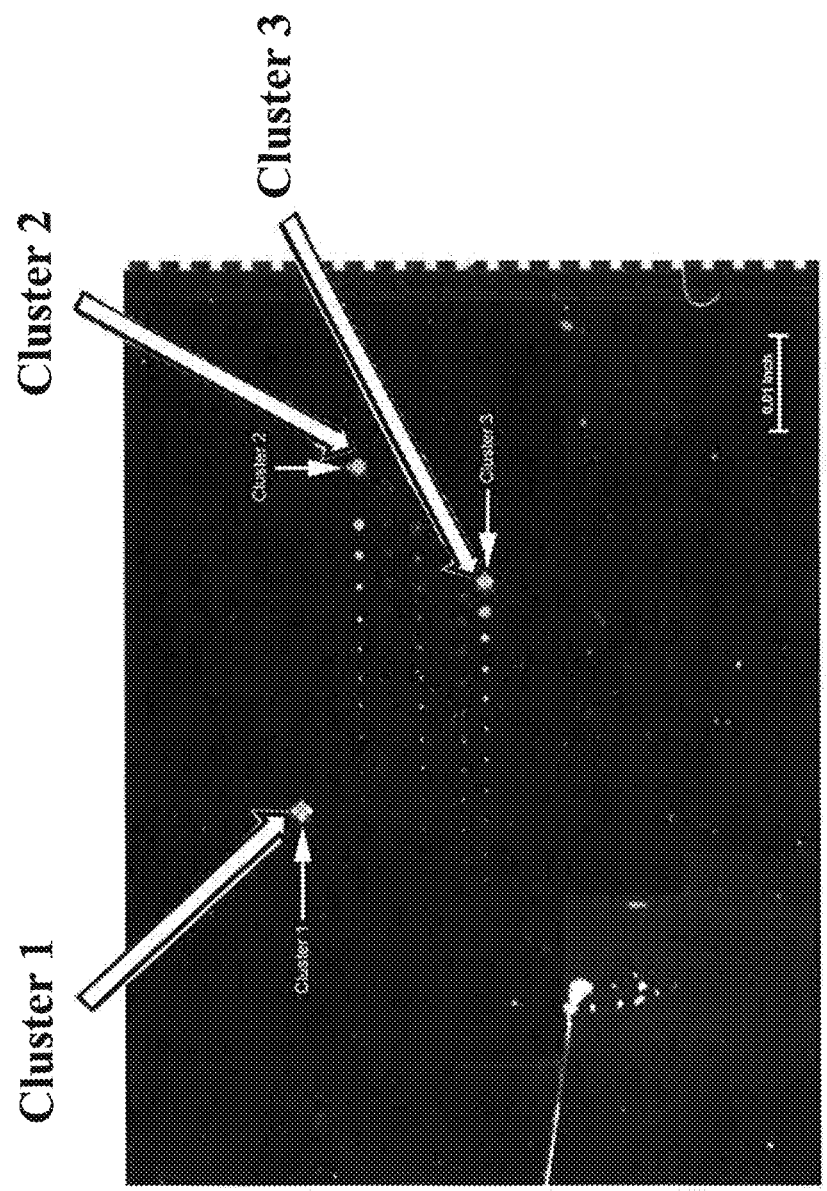
FIG. 3 is a dark field microscopy image of laser damage to an unprotected commercial backside-illuminated (BSI) sensor. The laser damage was induced by 532 nm and 1064 nm laser radiation.
Figure 4:
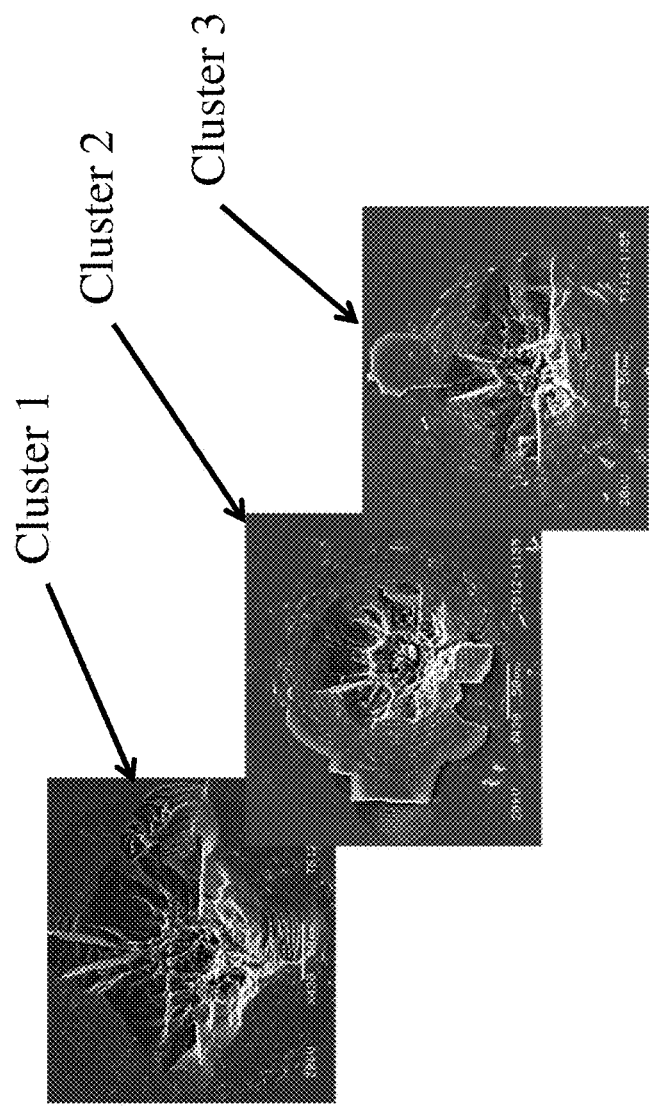
FIG. 4 includes three separate scanning electron microscopy (SEM) images of the laser damage from FIG. 3.

FIG. 3 illustrates thermally induced laser damage caused from 532 nm and 1064 nm lasers on an unprotected commercial BSI sensor. FIG. 4 includes three separate SEM images (at 430× magnification) of the morphology of the laser damage in FIG. 3. The SEM images were taken for the three largest damage spots marked in FIG. 3. In the most critical cases, the BSI silicon wafer contributed to the laser damage resistance, with the major damage modes including (1) thermally induced laser ablation, (2) radial fracturing, (3) melting of a kernel zone, and (4) large area thermal burning of the silicon substrate. The SEM images were taken for the three largest damage spots marked in FIG. 3. The major damage modes present in the images include thermally induced laser ablation, radial fracturing, melting of a kernel zone, and large area burning of the silicon substrate.

Figures 5A, 5B:
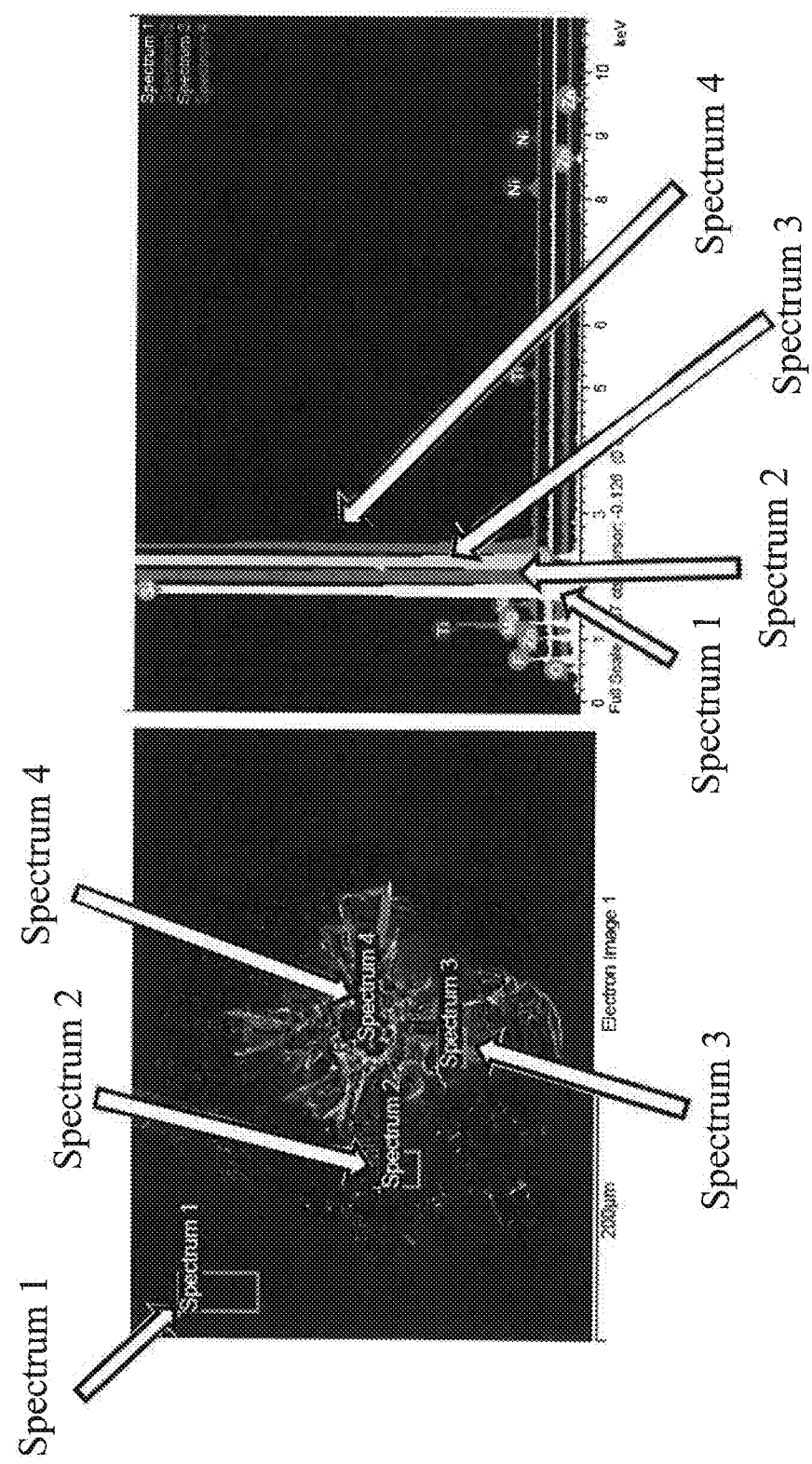
FIGS. 5A and 5B detail an exemplary energy-dispersive x-ray (EDX) spectroscopy spectral response (FIG. 5B) inside a laser-damaged crater (FIG. 5A)

FIG. 5B details an exemplary EDX spectral response from inside a laser damage crater shown in FIG. 5A. Details of the spectral response are listed below in Table 1. The results indicate that the high temperatures and fracturing affect not only the silicon substrate, but also destroy the circuitry and pixels. For example, molten metals, such as magnesium and nickel, were observed in the results from the frontal EDX scan.

TABLE 1

| | \multicolumn{9}{c}{EDX spectral response (all results in weight %)} | | | | | | | | |
|---|---|---|---|---|---|---|---|---|---|
| | O | F | Mg | Al | Si | S | Ti | Ni | Zn |
| Spectrum 1 | 2.15 | 8.39 | 2.08 | — | 82.14 | 2.08 | — | — | 3.17 |
| Spectrum 2 | — | — | — | — | 100 | — | — | — | — |
| Spectrum 3 | — | — | — | — | 100 | — | — | — | — |
| Spectrum 4 | 32.77 | — | — | 10.71 | 49.52 | — | 1.21 | 5.79 | — |

Example 2—Graphene/Polymer SLF

Figure 6B:
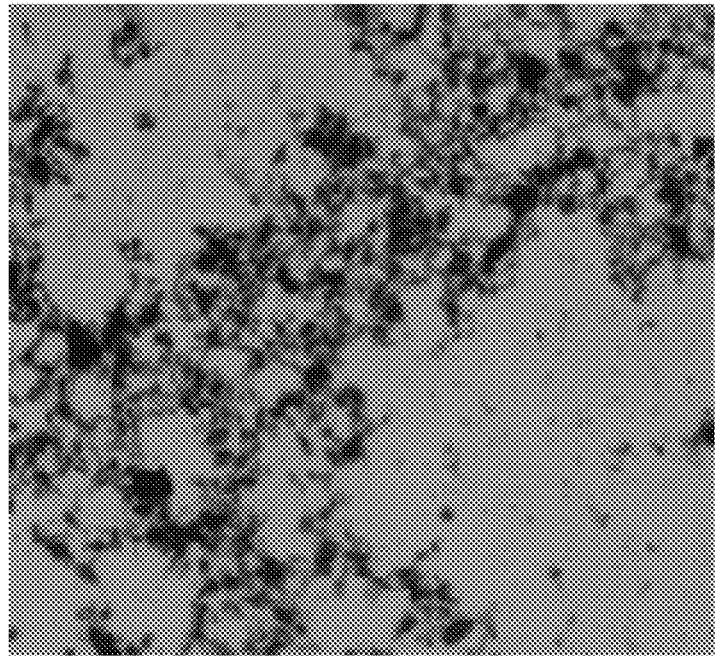
FIGS. 6A and 6B illustrate two images of graphene-epoxy layers deposited onto glass substrates with respective different concentrations of graphene clusters.
Figure 6A:
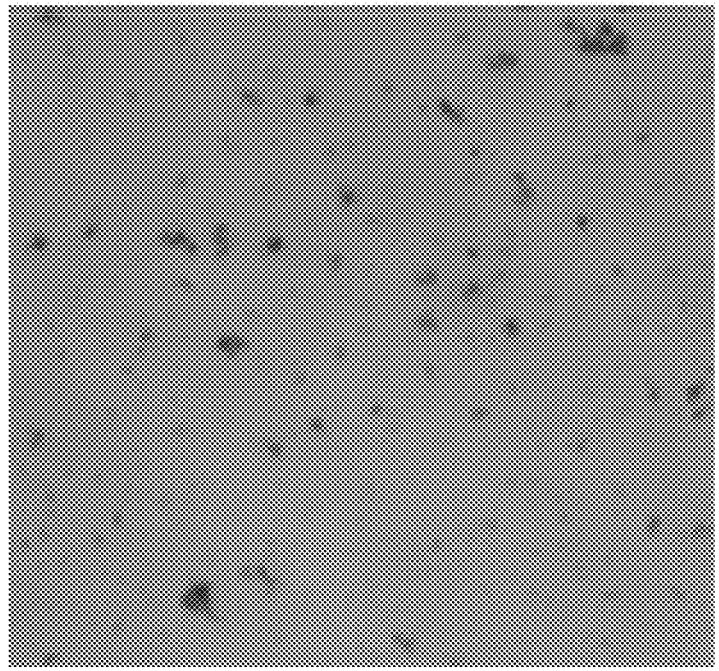

One or more of the disclosed SLFs may be used to alleviate some or all of the damage described above. For example, FIGS. 6A and 6B illustrate two images of graphene-epoxy layers deposited onto glass substrates. These two images define two different randomly distributed clusters of graphene embedded into an EPOTEK adhesive. The images were originally obtained at a magnification of 62.5× and then magnified by a factor of two. The image in FIG. 6A was obtained from a 2% nano-powder graphene/epoxy mixture that included EPOTEK 353ND and 327 as the requisite epoxy. The image in FIG. 6B conveys a concentration of nano-powder graphene in the epoxy to yield a transmission of 70%.

Example 3—Performance Results of an Exemplary SLF

Figure 7:
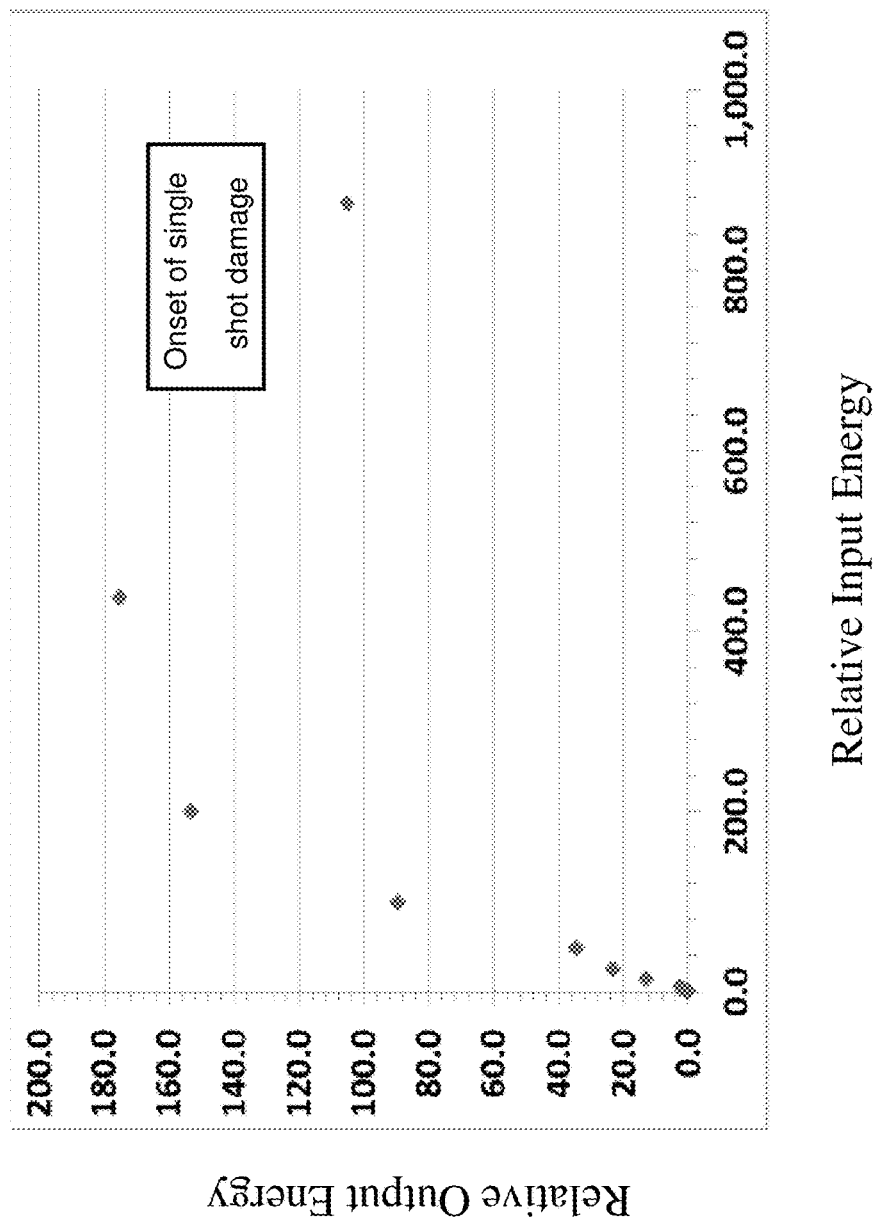
FIG. 7 is a chart illustrating the limiting effect of a graphene polymer SLF having an approximately 100 micron thick polymer film deposited onto a fused silica glass substrate.

FIG. 7 is a chart illustrating the limiting effect of a graphene/polymer SLF having an approximately 100 micron thick polymer film deposited on a fused silica glass substrate. The mass concentration of graphene in the polymer was about 2%. The achieved transmission is about 80%. The results indicate that the graphene/polymer SLF is capable of limiting the damage to the detector. For example, as the intensity of the unwanted radiation increases, the limiter is able to preserve the functionality of the detector (indicated by the output energy on the Y-axis energy scale) up to a certain level (from about 400 and lower on the X-axis energy scale).

Figure 8B:
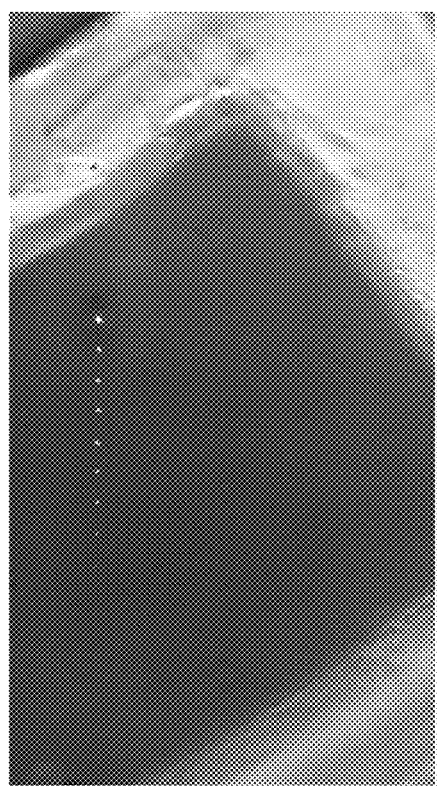
FIGS. 8A and 8B show two dark field microscopy images comparing laser damage on a conventional glass substrate (FIG. 8A) versus a substrate coated with one or more layers of graphene (FIG. 8B).
Figure 8A:
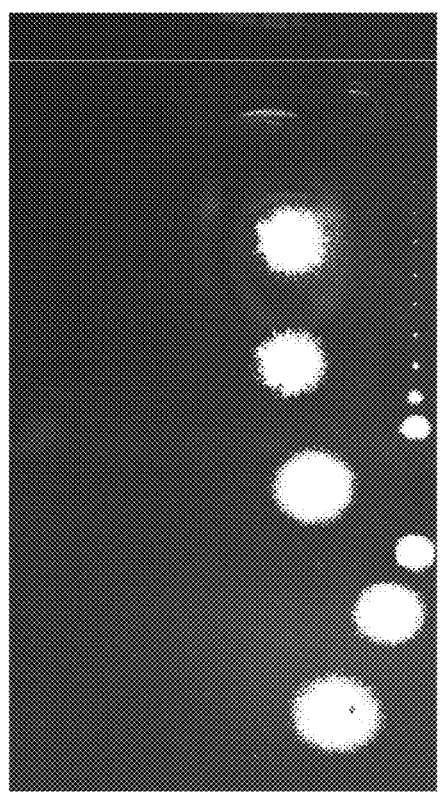

FIGS. 8A and 8B compare the results of induced laser damage on two different substrates. FIG. 8A illustrates damage induced by a laser on a conventional glass substrate coated with a layer of CNT/C60 that is mounted 300 microns above the detector. FIG. 8B illustrates laser damage induced by a laser on a conventional glass substrate coated with one or more layers of graphene that is mounted directly to the FPA detector. As illustrated, damage is reduced significantly when the graphene limiter is used. The graphene limiter material performs in a sacrificial manner, for example, by melting. Melting of the graphene serves to attenuate the energy of the laser, and therefore limit damage to the detector.

The SLF devices disclosed herein may provide one or more advantages over other semiconductor-based filters. For example, the glass substrate of an SLF may be placed close to the focal plane of an optical device, such as optical sensors and detectors. The SLF may provide superior optical quality and be capable of protecting detectors from pulsed laser damage. The SLF is also self-triggering, meaning it plays a passive role in the overall functionality of the optical device. The SLF may provide proper blocking of unwanted light beams in different types of commercial CCD focal planes and provide high resolution arrays. Several design options for integration of the SLF may also be utilized. For example, one or more layers of graphene may be deposited directly onto a silicon substrate of a commercial FPA, CCD camera, or other detector/sensor device. In another example, a polymer/graphene protecting layer may be lithographically coated onto an inexpensive glass substrate that may be inserted into the optical path of a sensor. The SLF may also provide a high quantum efficiency and operational sensitivity. Use of the SLF may also result in high optical transmission, for example, at values of 80-85%. The SLF is also inexpensive and cost efficient for integrating into a sensor manufacturing process. For example, in contrast to typical semiconductor filters, which experience low yield and high manufacturing costs, several dozen SLF filters may be manufactured in one production run with low manufacturing costs and high yields.

Having thus described several aspects of at least one major graphene-network-based embodiment of this invention, it is to be appreciated various alterations, modifications, and improvements will readily occur to those skilled in the art. Such alterations, modifications, and improvements are intended to be part of this disclosure. The invention is not limited in its application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items. Although embodiments detailed herein relate to electro-optical designs and fabrication technology of BGBOLs, these embodiments are offered merely for illustration and are not intended to limit the scope of the present invention. Various and further detailed configurations of BGBOL components and fabrication techniques are also considered within the scope of the present invention. Aspects and embodiments of the present invention may include several additional laser hardening subcomponents (layers, spacers, etc), which may be used for better protection of electro-optic sensors and integrated within with the electro-optic subcomponents of BGBOLs.

What is claimed is:

1. A method of fabricating a sacrificial limiter filter for an optical device, the method comprising:
   depositing a first layer of graphene onto a surface of a silicon substrate of the optical device, wherein the optical device is a backside-illuminated focal plane array (FPA) or a backside-illuminated charge coupled device (CCD) camera;
   depositing a first nano-layer of dielectric material onto the first layer of graphene;
   depositing a second layer of graphene onto the first nano-layer of dielectric material, the first layer of graphene, the first nano-layer of dielectric material, and the second layer of graphene forming a first dipole conductive structure;

depositing a third layer of graphene onto the second layer of graphene;

depositing a second nano-layer of dielectric material onto the third layer of graphene; and depositing a fourth layer of graphene onto the second nano-layer of dielectric material, the third layer of graphene, the second nano-layer of dielectric material, and the fourth layer of graphene forming a second dipole conductive structure, wherein the first, second, third, and fourth layers of graphene are configured to absorb and scatter at least a portion of electromagnetic radiation incident on the optical device and transmit at least 70% of electromagnetic radiation in a spectral range between about two and about eight microns.

2. The method of claim 1, wherein depositing the first layer of graphene comprises growing the first layer of graphene onto the surface of the silicon substrate.

3. The method of claim 1, wherein the silicon substrate is a first substrate and depositing at least one of the first, second, third and fourth layers of graphene comprises transferring graphene from a second substrate to the first substrate.

4. The method of claim 1, wherein depositing at least one of the first, second, third and fourth layers of graphene further comprising depositing at least one polymer, the at least one polymer having the graphene contained therein such that the graphene is mixed with the at least one polymer.

5. The method of claim 4, wherein the at least one polymer includes an epoxy oligomer, wherein the epoxy oligomer is at least one of an optical adhesive and an optical photoresist.

6. The method of claim 5, wherein a concentration of graphene in the at least one polymer is in a range of about 0.2% to about 3% by weight.

7. The method of claim 6, wherein a thickness of the at least one polymer having the graphene contained therein is in a range of about 50 microns to about 120 microns.

8. The method of claim 1, further comprising depositing alternating layers of low and high refraction dielectric materials onto the surface of the silicon substrate prior to depositing the first layer of graphene.

9. The method of claim 1, further comprising patterning the fourth layer of graphene such that the fourth layer of graphene exhibits surface plasmon resonance when exposed to desired frequencies of optical radiation.

10. A backside-illuminated CMOS detector comprising:
a silicon substrate; and
at least one layer of graphene-epoxy material consisting of graphene mixed within an optical epoxy adhesive oligomer disposed on a surface of the silicon substrate, the graphene-epoxy material having a thickness in a range of about 50 microns to about 120 microns and including a concentration of graphene in the optical epoxy adhesive oligomer that is about 2% by weight, the at least one layer of graphene-epoxy material including
a first layer of graphene onto a surface of a silicon substrate of the optical device,
a first nano-layer of dielectric material onto the first layer of graphene,
a second layer of graphene onto the first nano-layer of dielectric material, the first layer of graphene, the first nano-layer of dielectric material, and the second layer of graphene forming a first dipole conductive structure,
a third layer of graphene onto the second layer of graphene,
a second nano-layer of dielectric material onto the third layer of graphene, and
a fourth layer of graphene onto the second nano-layer of dielectric material, the third layer of graphene, the second nano-layer of dielectric material, and the fourth layer of graphene forming a second dipole conductive structure,
wherein the first, second, third, and fourth layers of graphene are configured to absorb and scatter at least a portion of electromagnetic radiation incident on the optical device and transmit at least 70% of electromagnetic radiation in a spectral range between about two and about eight microns.

11. The backside-illuminated CMOS detector of claim 10, wherein the at least one layer of graphene-epoxy material is patterned.

12. The backside-illuminated CMOS detector of claim 10, wherein the thickness of the at least one layer of graphene-epoxy material is about 100 microns.

13. The backside-illuminated CMOS detector of claim 10, wherein the graphene-epoxy material is about 75% to about 85% optically transmissive in the spectral range.

14. The backside-illuminated CMOS detector of claim 13, wherein the graphene-epoxy material is configured to block unwanted light radiation outside the spectral range.

* * * * *